(12) United States Patent
Jiang

(10) Patent No.: US 7,292,630 B2
(45) Date of Patent: Nov. 6, 2007

(54) LIMIT-CYCLE-FREE FIR/IIR HALFBAND DIGITAL FILTER WITH SHARED REGISTERS FOR HIGH-SPEED SIGMA-DELTA A/D AND D/A CONVERTERS

(75) Inventor: Zhongnong Jiang, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 783 days.

(21) Appl. No.: 10/417,507

(22) Filed: Apr. 17, 2003

(65) Prior Publication Data

US 2004/0208241 A1    Oct. 21, 2004

(51) Int. Cl.
*H03H 7/30* (2006.01)
*H03H 7/40* (2006.01)
*H03K 5/159* (2006.01)

(52) U.S. Cl. .................. 375/229; 375/350; 708/300
(58) Field of Classification Search ........... 375/229, 375/350; 708/300
See application file for complete search history.

(56) References Cited

U.S. PATENT DOCUMENTS

| | | | |
|---|---|---|---|
| 5,381,354 A * | 1/1995 | Soloff ..................... | 708/301 |
| 5,388,063 A | 2/1995 | Takatori et al. | |
| 6,158,027 A * | 12/2000 | Bush et al. .............. | 714/709 |
| 6,260,053 B1 * | 7/2001 | Maulik et al. ........... | 708/313 |
| 6,411,253 B1 * | 6/2002 | Cox et al. ................ | 342/194 |
| 6,573,940 B1 * | 6/2003 | Yang ....................... | 348/441 |
| 6,707,848 B2 * | 3/2004 | Agazzi et al. .......... | 375/229 |
| 7,007,053 B1 * | 2/2006 | Malik et al. ............ | 708/300 |
| 2001/0040933 A1 * | 11/2001 | Eriksson et al. ....... | 375/350 |

FOREIGN PATENT DOCUMENTS

DE   23 49 227 A1   4/1975
EP   0 948 133 A2   10/1999

OTHER PUBLICATIONS

Rashid, Ansari and Bede Liu, Fellow, "A Class of Low-Noise Computationally Efficient Recursive Digital Filters With Applications to Sampling Rate Alterations," *IEEE Transactions on Acoustics, Speech, Processing*, Feb. 1985, pp. 90-97, ASSP-33, vol. 1.

Rashid Ansari and Bede Liu: "A Class of Low-Noise Computationally Efficient Recursive Digital Filters With Applications to Sampling Rate Alterations," IEEE Transactions on Acoustics, Speech, and Signal Processing, vol. ASSP-33, No. 1, Feb. 1985 (pp. 90-97).

* cited by examiner

*Primary Examiner*—David C. Payne
*Assistant Examiner*—Nader Bolourchi
(74) *Attorney, Agent, or Firm*—Wade J. Brady, III; Frederick J. Telecky, Jr.

(57) ABSTRACT

A multiplexed FIR/IIR digital filter structure (300) which offers linear phase response and low group delay by switching on a FIR filter portion (31) or a IIR filter portion (32). To reduce the silicon area, the FIR/IIR filter (300) shares registers which is enabled because the FIR and IIR processing do not use the registers at the same time but rather consecutively. Further, the multiplexed FIR/IIR digital filter structure (300) can offer limit-cycle-free IIR operation using two's-complement truncation in combination with positive valued allpass coefficients.

16 Claims, 1 Drawing Sheet

LIMIT-CYCLE-FREE FIR/IIR HALFBAND DIGITAL FILTER WITH SHARED REGISTERS FOR HIGH-SPEED SIGMA-DELTA A/D AND D/A CONVERTERS

BACKGROUND OF THE INVENTION

1. Technical Field of the Invention

The present invention generally relates to integrated circuit digital filter structures and, more particularly, to a multiplexed FIR/IIR digital filter structure.

2. Description of Related Art

A fundamental building block in the field of digital signal processing is the digital filter. As is elementary in this field, digital filters refer to the filtering of sampled-data or discrete-time signals which are typically digital representations of analog signals which have been generated by way of analog-to-digital conversion. Fundamentally, a digital filter is a computational process, carried out either through dedicated hardware or through the execution of a sequence of instructions by programmable logic, by way of which an input sequence of numbers is converted into an output sequence of numbers, modified by a transfer function. Typical transfer functions refer to the frequency characteristics of the filter; analogously to analog filter counterparts, examples of digital filter transfer functions include low-pass, high-pass, band-pass, etc. Digital filter computations typically include digital addition, digital multiplication of signal values by constants, and the insertion of delay stages.

As is also well known in the art, digital filters are often classified according to their impulse response. Finite impulse response (FIR) digital filters refer to the class of filters in which only a finite number of input samples affect the generation of a given output sample; typically, FIR digital filters perform computations upon a finite number of input samples (i.e., the current sample, and a selected number of preceding input samples), in a non-recursive fashion. Infinite impulse response (IIR) digital filters are a class of filters in which previous output samples are also used in generating a current output sample, and are thus typically realized in a recursive fashion, including feedback of output sample values. Because of the feedback of prior output values, each current output value of an IIR filter depends upon the value of an infinite series of input sample values, hence the term "infinite impulse response".

Due to their high computation efficiency, both FIR and IIR halfband (HB) digital filters are widely employed in Sigma-Delta A/D and D/A converters to perform decimation/interpolation functions. A cascade of a number of HB filters can be used to filter and decimate oversampled 1-bit or mutli-bit signals by a factor of power-of-two number in Sigma-Delta A/D converters for example. The interpolation function is performed in Sigma-Delta D/A converters.

Because of their linear phase response, FIR HB filters have been more frequently employed eventhough the higher computational complexity of FIR HB filters requires larger silicon area than that of their IIR counterparts. FIR HB filters also have a relatively long group delay. In a cascade of several FIR HB filters for decimation purpose the dominant group delay lies in the last stage, which usually is a very high-order filter because of narrow transition band need. Since the group delay of an FIR HB filter is proportional to its order, the delay cannot be effectively reduced without lowering the filter performance.

One disadvantage with IIR digital filters is due to a well-known problem referred to as "limit cycles". The limit cycle problem is manifest in digital filters that generate a self oscillating behavior caused by nonlinearity of quantizers. One example of this limit cycle behavior is the response of a filter when the input of the filter is reduced to zero. Rounding errors caused by the use of finite precision arithmetic mean that the output of the filter does not necessarily reduce to zero when the input reduces to zero. Instead, the output can stay at a non-zero value or oscillate about zero. Although it is well known to use magnitude truncation as the quantization approach to reduce the zero-input limit cycles in a first-order IIR filter, this approach is very complex and can be very expensive.

A new approach is desirable for applications in which lower filter performance is not an option and low group delay is desired, particularly for high speed sample rates (i.e., 250 kHz and higher).

SUMMARY OF THE INVENTION

The present invention achieves technical advantages as an apparatus, system and method of offering either FIR filter or IIR filter processing from a multiplexed filter arrangement which can offer both linear phase response and lower group delay. By switching between a FIR filter portion and a IIR filter portion, register sharing can be implemented to reduce hardware complexity. Furthermore, by taking advantage of all positive valued coefficients in an IIR HB filter, a simple two's-complement truncation approach over its more complicated magnitude truncation counterpart can be employed with no zero-input limit-cycles.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
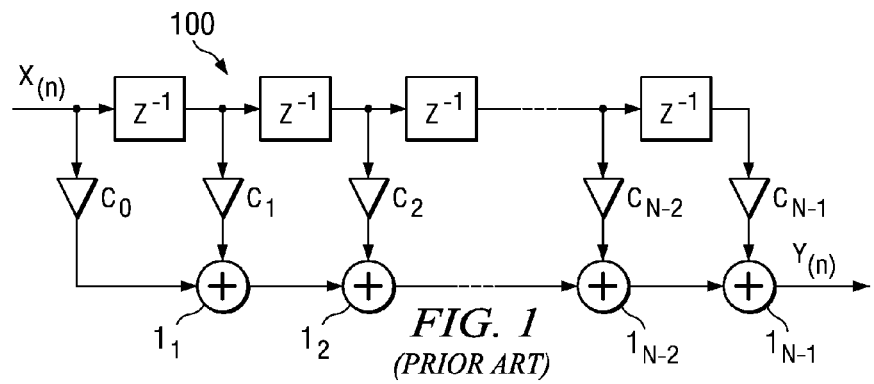
FIG. 1 illustrates an exemplary prior art filter structure.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

Referring now to FIG. 1 there is illustrated an exemplary prior art filter structure 100. In the cascade of FIR filters, which is commonly structured in the direct configuration shown in FIG. 1, the input data samples x(n) are delayed by a string of one unit delays $z^{-1}$ (also referred to as registers) and processed by an array of multipliers $C_k$, k=0, ..., N-1 followed by adders $1_1$ through $1_{N-1}$. These multipliers are often called "taps" and the multiplier coefficients $C_k$ are often called tap coefficients. Each multiplier and adder is typically a full hardware implementation of the arithmetical function for performing computations on a full input data word. While FIG. 1 has been referred to as a FIR filter, it should be understood (and is well known that the same structures can implement the well-known correlation operation.

In practice, IIR filters are very efficient when represented in a polyphase form and they can be implemented with only first-order allpass functions. As described in, among other sources, Ansari and Liu, "A Class of Low-Noise Computationally Efficient Recursive Digital Filters with Application to Sampling Rate Alterations", *Transactions on Acoustics, Speech, and Signal Processing* (IEEE, Vol. ASSP-33, No.1, February 1985), pp. 91-97, the description of which is incorporated by reference herein. Moreover, a first-order allpass function requires just one register, one multiplier and three adders. This approach is particularly advantageous in high-speed (sample rate of approximately 250 kHz and higher) Σ-Δ A/D and D/A converters where the digital filter is mostly implemented in hard-wired circuits rather than a micro code based scheme in their low speed counterparts. The following describes the IIR portion of the multiplexed FIR/IIR filter in accordance with and exemplary embodiment of the present invention. The following $5^{th}$-order example is used to illustrate the highly efficient characteristics of IIR HB Filters:

$$H(z) = 0.5 \frac{\alpha_0 + z^{-2}}{1 + \alpha_0 z^{-2}} + 0.5 z^{-1} \frac{\alpha_1 + z^{-2}}{1 + \alpha_1 z^{-2}} \quad (1)$$

where $0<\alpha_0$, $\alpha_1<1$. Since equation (1) is an efficient polyphase form, the actual implementation of a second-order allpass section degenerates to a first order allpass filter. As a result only two first-order allpass filters are involved in this $5^{th}$-order IIR HB filter.

Figure 2:
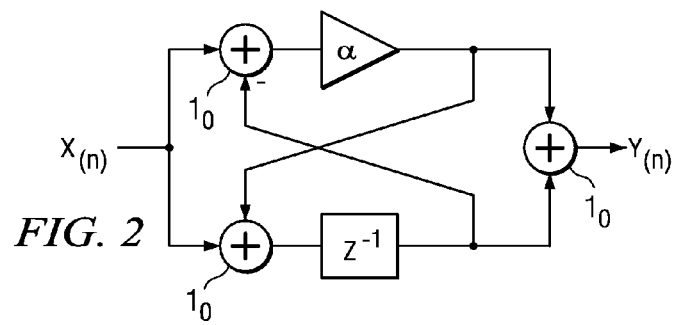
FIG. 2 illustrates a first-order allpass IIR filter section in accordance with an exemplary embodiment of the present invention.
Figure 5:
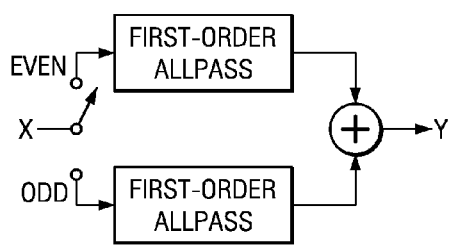
FIG. 5 shows a polyphase implementation for a $5^{th}$-order IIR halfband digital filter.

A first-order allpass section can be implemented by using only one register ($z^{-1}$) one multiplier ($\alpha$) and three adders ($1_0$) shown in FIG. 2. Based on Equation 1 a $5^{th}$-order IIR HB filter needs 5 registers (i.e., 2+1+2). However, the HB filter is always employed for decimation-by-two (or interpolation-by-two) function so a so-called polyphase form is typically used. In a polyphase form, the implementation of Equation 1 becomes a sum of two first-order IIR all pass functions, each of which needs only one register. The middle delay of Equation 1 vanishes and is replaced by a decimator. Thus, a $N_{IIR}^{th}$-order IIR HB filter includes $(N_{IIR}-1)/2$ multipliers and $(N_{IIR}-1)/2$ registers. An FIR HB filter has its own polyphase form, and can be implemented by using) $N_{fir\_1})/2$ registers. It is conventional practice to use a polyphase form to implement any FIR or IIR decimation or interpolation digital filter. FIG. 5 illustrates the polyphase form that implements an IIR HB filter. This implementation comprises one decimator and a sum of two first-order IIR allpass filters.

Figure 3:
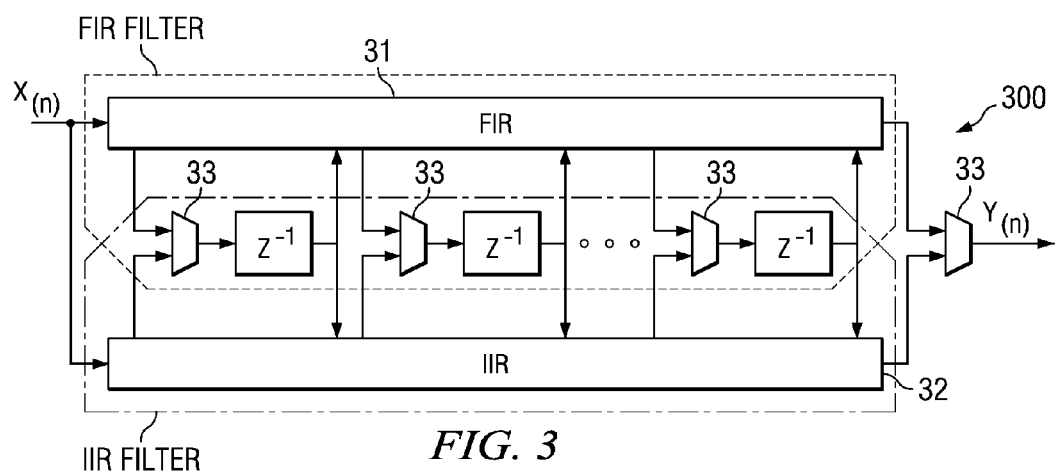
FIG. 3 illustrates a multiplexed FIR/IIR HB filter in accordance with an exemplary embodiment of the present invention.

Referring now to FIG. 3 there is illustrated a multiplexed FIR/IIR HB filter 300 in accordance with an exemplary embodiment of the present invention. Data x(n) to be processed is input at respective inputs for a FIR filter portion 31 and a IIR filter portion 32. In a hardware implementation, the IIR HB filter reuses registers ($z^{-1}$) implemented in the FIR filter. For example, for an $N_{FIR}^{th}$-order FIR HB filter having $N_{FIR}$ registers, $(N_{IIR}-1)/2$ registers of the above-discussed IIR HB filter are reused from the FIR filter. In general $N_{FIR}>>N_{IIR}$ for comparable FIR and IIR HB filter performance, so the FIR filter portion 31 may include other registers not shared by the IIR HB filter. In addition, both the FIR filter portion and the IIR filter portion can include combination logic for implementing the switching process. Further, components of the combinational logic for the FIR filter portion 31 and the IIR filter portion 32 can also be shared.

As shown in FIG. 3, $(N_{IIR}-1)/2$ multiplexers 33 are included for implementing sharing of registers ($z^{-1}$). Additionally, a multiplexer 33 is coupled to the output of each of the FIR 31 and IIR filter portions 32. The multiplexers 33 are configured to enable switching of the shared registers for the FIR filter and the IIR filter. Though multiplexers are included in this implementation, the corresponding reduction in registers greatly offsets the increase in area due to the multiplexers, because a multiplexer consumes a much smaller area in silicon than a register. Additionally, a multiplexer is not clock operation dependent which lessens complexity.

The multiplexed FIR/IIR HB digital filter structure 300 has linear phase response and low group delay via switching from/to FIR and IIR. For a FIR filter portion 31 which includes a cascade of FIR filters such as that illustrated in FIG. 1, used for decimation in high-speed Σ-Δ A/D converters for example, the IIR filter portion 32 is turned on for the last decimation-by-two stage (or for the first interpolation stage in high-speed Σ-Δ D/A converters). Since the last FIR or IIR decimation stage is switched on the fly, the shared registers are not used at the same time for the respective FIR and IIR functions. In one embodiment, the multiplexed FIR/IIR HB digital filter 300 also share hardware multipliers when coefficients of the FIR and IIR filters that have common factors enabling further reduction of silicon area.

Compared with their FIR counterparts in general, hardware implementations of IIR digital filters encounter many more nasty stability issues. One of them is the zero-input limit cycles, a self-oscillating behavior that is caused by nonlinearity of quantizers located in feedback loops. Although it is well known to use magnitude truncation as the quanitization approach to reduce the zero-input limit cycles in a first-order IIR filter, this approach is very complex and can be very expensive. At least one embodiment of the present invention uses two's-complement truncation approach in combination with positive valued allpass coefficients to eliminate zero-input limit cycles for the IIR filter portion 32.

Although the zero-input limit cycle behavior of an IIR digital filter is complex and difficult to analyze, there is comprehensive knowledge of the limit cycle behavior in a first-order IIR filter. As further described in A. V. Oppenheim and R. W. Shafer, *Discrete-Time Signal Processing*, Prentice Hall, Inc., Englewood Cliffs, N.J., 1989, Chapter 6, the description of which is hereby incorporated by reference, a stable first-order IIR filter can have zero-input limit cycles when a rounding quantization approach is used. But if a magnitude truncation quantization is involved, then no zero-input limit cycles can exist. It will become apparent from the following description that applying a two's-complement truncation to the recursive loops in an IIR filter is an efficient and advantageous quantization approach for inhibiting limit cycles.

Figure 4:
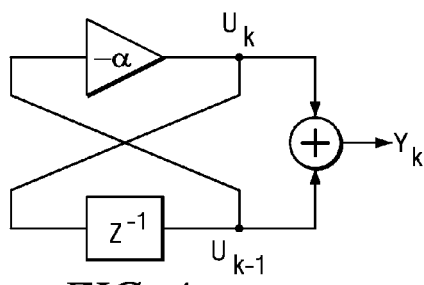
FIG. 4 shows a simplified illustration of the first-order allpass filter depicted in FIG. 2 for the zero input.

For the zero input, a first-order allpass filter depicted in FIG. 2 can be simplified as illustrated in FIG. 4, where;

$$y_k = u_k + u_{k-1} \quad (2a)$$

and $$u_k = Q[-\alpha u_{k-1}], \quad (2b)$$

where Q represents a simple two's-complement truncation quantization and the error item $\epsilon_k$ is introduced as:

$$\epsilon_k = u_k + \alpha u_{k-1}. \quad (3)$$

Now it is assumed that both $y_k$ and $u_k$ are integers. Then from the definition of the two's complement truncation $\epsilon_k$ is confined to $$-1 < \epsilon_k \leq 0. \quad (4)$$

From equations (2b) and (4) it is obvious to arrive $$|u_k| = |\alpha u_{k-1} + \epsilon_k| < |\alpha u_{k-1}| + 1 < |u_{k-1}| + 1. \quad (5)$$

Because both $y_k$ and $u_k$ are integers it should be recognized $$|u_k| \leq |u_{k-1}|. \quad (6)$$

Equation (6) implies that only the following two types of limit cycles can exist;

$$u_k = u_{k-1} \quad (7a)$$

and $$u_k = -u_{k-1}. \quad (7b)$$

If equation (7a) is substituted into equation (3), equation (3) becomes, $$\epsilon_k(1+\alpha)u_k. \quad (8)$$

For equation (8) to be valid it requires $\alpha$ be negative and its absolute value close to one. Considering that stable IIR HB filters based on some well-known functions as such as Butterworth or Elliptic functions have all their poles located on the imaginary axis (as discussed in P. P. Vaidyanathan, Multirate Systems and Filter Banks, Prentice Hall, Inc., Englewood Cliffs, N.J., 1993, Chapter 5, the description of which is hereby incorporated by reference), and this indeed means all coefficients are positive valued or $0 < \alpha < 1$. It can now be concluded, therefore, the zero-input limit cycles of type (7a) become impossible.

By substituting equation (7b) into equation (3) we have $$\epsilon_1 = -u_0 + \alpha u_0 \quad (9a)$$

and $$\epsilon_2 = -u_0 + \alpha u_0. \quad (9b)$$

Which imply that $$\epsilon_1 = \epsilon_2. \quad (10)$$

This directly contradicts equation (4) as long as the quantization errors have non-zero values. Thus, both types of limit cycles (7a) and (7b) are not possible, and thus the IIR HB filter illustrated in FIGS. 2 and 4 is indeed free of the zero-input limit cycle behavior even though a simple two's-complement truncation is in use.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A limit-cycle free digital filter comprising;
   a finite impulse response (FIR) filter having a first plurality of delay elements implemented for processing data;
   a infinite impulse response (IIR) filter having a second plurality of delay elements implemented for processing said data;
   wherein a shared plurality of delay elements is contained in said first plurality of delay elements and said shared plurality of delay elements is also contained in said second plurality of delay elements;
   a multiplexer system coupled to said FIR filter and said IIR filter for switching said shared plurality of delay elements therebetween; and
   wherein said shared plurality of delay elements are used consecutively for FIR filter data processing and IIR filter data processing.

2. The digital filter of claim 1, wherein the number of delay elements of said first plurality of delay elements is greater than that of said second plurality of delay elements and the number of delay elements of said shared plurality of delay elements is equal to said second plurality of delay elements.

3. The digital filter of claim 1, wherein said IIR filter has an nth-order where n is greater than 1, and the number of said shared plurality of delay elements is equal to (n-1)/2.

4. The digital filter of claim 1, wherein said multiplexer system includes a multiplexer for each of said delay elements in said shared plurality of delay elements.

5. The digital filter of claim 1, wherein said FIR filter and said IIR filter process said data at a sample rate greater than 250 kHz.

6. The digital filter of claim 1, wherein said IIR filter includes two's-complement truncation quantization.

7. The digital filter of claim 1 further providing reduced group delay during processing of said data via switching from and to said FIR filter and said IIR filter for multiplexed processing.

8. A limit-cycle free digital filtering system comprising:
   a signal source for generating a digital signal;
   a digital filter having an Nth-order and coupled to said signal source for receiving and filtering said digital signal by performing a sequence of operations including delaying products of said digital signal with filter coefficients for each order of said digital filter, said digital filter comprising:
   a finite impulse response (FIR) filter having an input for receiving said digital signal and an output for outputting a filtered signal corresponding to said digital signal, said FIR filter further having an $N_{FIR}^{th}$-order and a plurality of delay elements corresponding to $N_{FIR}$;
   a infinite impulse response (IIR) filter having an input for receiving said digital signals and an output for outputting a filtered signal corresponding to said digital signal, said IIR filter further having an $N_{IIR}^{th}$-order and a plurality of delay elements corresponding to NIIR;

a multiplexer system coupled to said FIR filter and said IIR filter for switching a shared plurality of delay elements which are included in both said FIR filter and said IIR filter.

9. The system of claim 8, wherein the number of said FIR filter delay elements is greater than that of said IIR filter delay elements and all of said IIR filter delay elements are in said shared plurality of delay elements.

10. The system of claim 8, wherein the number of delay elements of said IIR is equal to $(N_{IIR}-1)/2$ and all of said IIR filter delay elements are in said shared plurality of delay elements.

11. The system of claim 8, wherein said multiplexer system includes a multiplexer for each delay element switched between said FIR filter and said IIR filter.

12. The system of claim 8, wherein said digital filter processes said digital signal at a sample rate greater than 250 kHz.

13. The system of claim 8, wherein said IIR filter further including a quantization means for eliminating limit cycle behavior, wherein said quantization means is two's-complement truncation quantization.

14. The system of claim 8 further providing reduced group delay during processing of said digital signal via switching from and to said FIR filter and said IIR filter for multiplexed processing.

15. The system of claim 8, wherein said delay elements switched between said FIR filter and said IIR filter are used consecutively for FIR processing and IIR processing.

16. The system of claim 8, wherein said delay elements switched between said FIR filter and said IIR filter comprise a portion of said FIR filter delay elements and a portion of said IIR filter delay elements.

* * * * *